United States Patent [19]
Tola et al.

[11] Patent Number: 6,003,369
[45] Date of Patent: Dec. 21, 1999

[54] METHOD FOR MANUFACTURING ENCAPSULATED SEMICONDUCTOR DEVICES

[75] Inventors: Jeffry Tola, Bloomfield; David John McArdle, Royal Oak; Joseph William Theut, Shelby Twp.; Donald Walter Bialokur, Holly, all of Mich.

[73] Assignee: Continental Teves, Inc., Auburn Hills, Mich.

[21] Appl. No.: 08/858,258

[22] Filed: May 19, 1997

[51] Int. Cl.⁶ .............................. G01P 1/02; H01L 21/00
[52] U.S. Cl. .................. 73/493; 29/827; 257/686
[58] Field of Search .................. 073/493, 494; 324/252, 775; 257/686, 692; 29/827

[56] References Cited

U.S. PATENT DOCUMENTS

| | | |
|---|---|---|
| 3,851,383 | 12/1974 | Peltz . |
| 3,967,366 | 7/1976 | Birglechner et al. . |
| 4,196,959 | 4/1980 | Chesemore et al. . |
| 4,637,130 | 1/1987 | Fujii et al. . |
| 4,859,632 | 8/1989 | Lumbard ................................. 29/827 |
| 5,210,493 | 5/1993 | Schroeder et al. . |
| 5,315,245 | 5/1994 | Schroeder et al. . |
| 5,371,943 | 12/1994 | Shibata ..................................... 29/827 |
| 5,498,902 | 3/1996 | Hara ....................................... 257/686 |
| 5,557,145 | 9/1996 | Kobayashi .............................. 257/692 |
| 5,559,433 | 9/1996 | Onizuka . |
| 5,572,120 | 11/1996 | Takaishi et al. . |

FOREIGN PATENT DOCUMENTS

| | | |
|---|---|---|
| 2855838 | 6/1979 | Germany . |
| 53-9468 | 1/1978 | Japan . |

*Primary Examiner*—Hezron Williams
*Assistant Examiner*—Helen C. Kwok
*Attorney, Agent, or Firm*—Rader, Fishman & Grauer PLLC

[57] ABSTRACT

A method for manufacturing encapsulated semiconductor devices, including rotary speed sensing devices, by using a lead frame. Electrical terminals of the semiconductor device are electrically connected to electrical leads from the lead frame. The semiconductor device is encapsulated in a plastic housing which is also connected to positioning posts located on the lead frame. The electrical leads are disconnected from the lead frame, permitting additional processing of the semiconductor device, including testing.

2 Claims, 1 Drawing Sheet

METHOD FOR MANUFACTURING ENCAPSULATED SEMICONDUCTOR DEVICES

TECHNICAL FIELD

This invention relates to a method of manufacturing plastic encapsulated semiconductor devices, including rotary motion measuring devices, and more particularly to methods of manufacture incorporating the use of a lead frame to position semiconductor devices for manipulation and processing.

BACKGROUND OF THE INVENTION

Measuring rotary motions, and, in particular, the speed and the rotational behavior of individual wheels on a vehicle is of great importance in connection with automotive vehicle control systems such as systems for anti-lock control brake systems, traction slip control, and suspension control, etc. Sensors for these types of applications must be durable, reliable, inexpensive to manufacture, easy to assemble, easy to diagnose, replace, and maintain.

Semiconductor devices, including rotary motion sensing devices, typically are mass produced and automatically assembled. Thus, positioning the device, protecting the device, and being able to test the device during the assembly process are important considerations to the manufacturing of such devices.

One known method of positioning semiconductor devices during the assembly process consists of using carriers, which are separate from the semiconductor devices and which cradle the semiconductor devices during assembly. One of the problems associated with this method is that the carriers tend to be relatively large compared to the semiconductor devices being processed, requiring more space during the assembly process and making the use of carriers somewhat awkward. Another problem associated with this method is that carriers, by themselves, provide limited protection to the semiconductor devices during the assembly process.

SUMMARY OF THE INVENTION

It is an object of this invention to provide a method of manufacturing plastic encapsulated semiconductor devices, including wheel speed-sensing devices, wherein said method permits easy and effective positioning of the devices, added protection for the devices, and the ability to test the operational qualities of the devices during the assembly process. This object is accomplished by connecting the electrical terminals of the semiconductor device to the electrical leads of a metal lead frame. Then the semiconductor device is encapsulated in a plastic housing which is attached to four positioning posts on the metal lead frame. The function of the positioning posts is to maintain the semiconductor device in a stationary position relative to the lead frame. Then the electrical leads are disconnected from the lead frame permitting testing of the semiconductor device prior to additional processing. The plastic housing protects the semiconductor device from possible damage during the continuing assembly process. The positioning posts, by maintaining the semiconductor device's position relative to the lead frame, permits the electrical leads to be disconnected from the lead frame and the device to be tested at any time during the assembly process.

The above and other objects and features of the present invention will become apparent from the following detailed description of the preferred embodiments when taken in conjunction with reference to the accompanying drawings.

DETAILED DESCRIPTION OF THE INVENTION

Figure 1A:
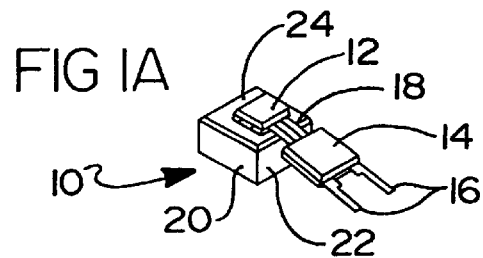
FIG. 1A shows a semiconductor device prior to any processing.

In accordance with FIGS. 1A, 1B, 1C and 1D, a wheel speed sensing semiconductor device 10 has a sensor member 12 having a sensing face 11, and further has a signal conditioning integrated circuit 14 having electrical terminals 16. Sensor member 12 and signal conditioning member 14 are electrically connected together by electrical leads 18, and electrical terminals 16 are connected to electrical leads 34. Sensor member 12 operates to sense and transmit data regarding the rotational speed or other characteristics of a vehicle wheel. Signal conditioner 14 receives the transmitted data from sensor 12, processes the data, and transmits output to a microprocessor (not shown) via electrical terminals 16 and electrical leads 34.

Magnet 20 has horizontal side 22 and vertical face 24. Sensor member 12 is attached to vertical face 24 such that sensing face 11 of sensor 12 is directed away from magnet 20. Semiconductor device 10 is encapsulated by plastic housing 40 such that sensing face 11 is exposed to permit it to receive sensed data from a rotating wheel. Plastic housing 40 operates to enclose and protect sensing semiconductor device 10 during processing.

Because of certain space limitations, speed sensing semiconductor devices 10 used in vehicles may incorporate various orientations of sensor 12 relative to signal conditioning integrated circuit 14. FIGS. 1A–1D illustrates the disclosed method of manufacture in connection with a semiconductor device 10 having a slightly bent, but approximately linear orientation. FIG. 2 illustrates several semiconductor devices 10 arranged on a continuous reel where sensor 12 is oriented approximately 90° relative to signal conditioning integrated circuit 14. One advantage of orienting sensor member 12 and sensing face 11 approximately 90 degrees relative to the signal conditioning integrated circuit 14 is that this orientation permits sensing semiconductor device 10 to be positioned laterally relative to a vehicle wheel so that rotational data, including rotational speed of the wheel, can be sensed from the face of the wheel as opposed to the radial edge of the wheel. This lateral positioning of sensing semiconductor device 10 is critically important in applications where there is very little space between the radial edge of the vehicle wheel and the surroundings. The process illustrated in FIG. 1 is identical to that as applied to a sensing semiconductor device 10 having sensor member 12 and signal conditioning member 14 positioned approximately 90 degrees relative to each other as illustrated in FIG. 2. FIG. 1 and FIG. 2 illustrate slightly different embodiments of lead frame 30.

Figure 2:
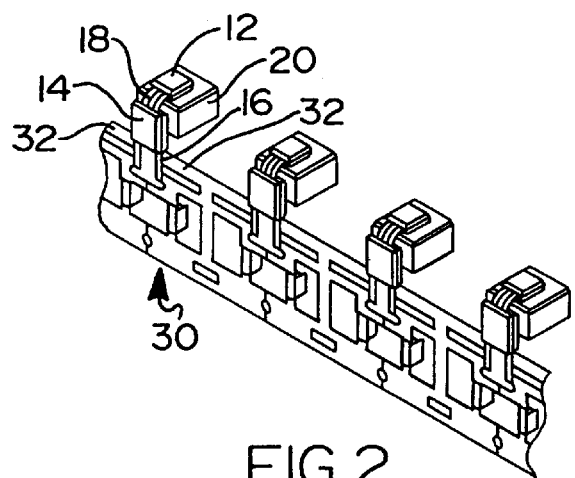
FIG. 2 is a perspective view of four continuous lead frames used with a semiconductor device with a 90° orientation.

FIG. 1A illustrates sensing semiconductor device 10 prior to any processing. Sensor member 12 is electrically connected by electrical leads 18 to signal conditioning member 14. Sensor member 12 is attached to vertical face 24 of magnet 20 and signal conditioning member 14 extends outward away from magnet 20 and sensor member 12. When this method of manufacture is applied to a wheel speed sensing semiconductor device 10 having the orientation illustrated in FIG. 2, the first step of the process is to position sensor member 12 and signal conditioning member 14 approximately 90 degrees relative to each other.

Figure 1B:
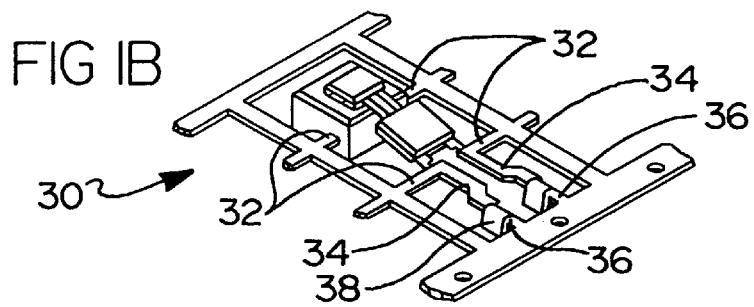
FIG. 1B shows the semiconductor device positioned relative to a lead frame and the electrical terminals of the semiconductor device attached to the electrical leads of the lead frame.

FIG. 1B illustrates the next step in the process. Sensing semiconductor device 10 is positioned relative to a metal lead frame 30. Lead frame 30 has positioning posts 32 and electrical leads 34. Electrical leads 34 are integrally attached to lead frame 30 by connecting leads 36. After wheel speed sensing semiconductor device 10 is positioned relative to lead frame 30, electrical terminals 16 are electrically connected to electrical leads 34. Electrical leads 34 are used to permit electrical communication between signal conditioning member 14 and a microprocessor (not shown) during normal usage of semiconductor device 10. Electrical leads 34 may incorporate structures for facilitating electrical connection between the semiconductor device 10 and other electrical devices, such as crimping baskets 38.

Figure 1C:
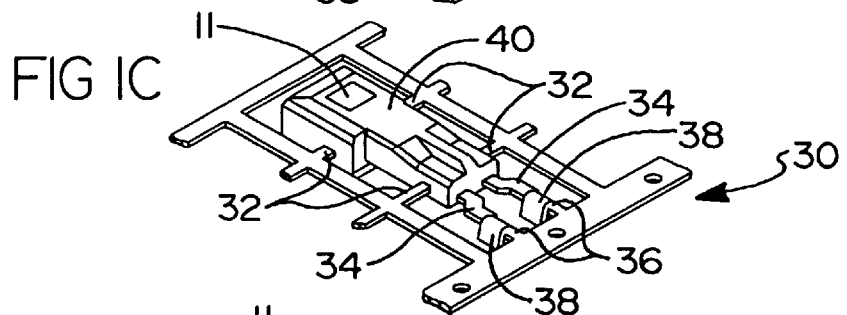
FIG. 1C shows the semiconductor device encapsulated in a plastic housing and the plastic housing attached to positioning posts on the lead frame.

FIG. 1C illustrates the next step in the described process. Semiconductor device 10 is encapsulated in plastic housing 40, except that sensing face 11 of sensor member 12 is left exposed. During the plastic encapsulation, plastic is permitted to contact positioning posts 32, thereby creating a bond between semiconductor device 10, plastic housing 40, and positioning posts 32.

Figure 1D:
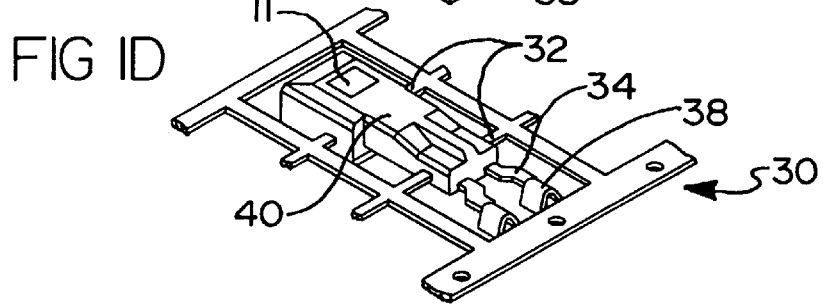
FIG. 1D shows the electrical leads disconnected from the lead frame and the semiconductor device maintained stationary relative to the lead frame by the positioning posts.

FIG 1D illustrates the next step in the described process. Electrical leads 34 are electrically disconnected from lead frame 30 by cutting connecting leads 36. Even though semiconductor device 10 is no longer connected to lead frame 30 by electrical leads 34, semiconductor device 40 is maintained in relative position by positioning posts 32.

At this point, semiconductor device 10 undergoes additional processing, including possible electrical testing, while being maintained in a stationary position relative to lead frame 30. Lead frame 30 provides accurate positioning information relating to semiconductor device 10 as it proceeds down a manufacturing assembly line. The described process is suitable for use with well-known automated pick and place methods and reel to reel processing methods of manufacture.

The disclosed invention provides several advantages over the prior art. First, plastic housing 40 provides protection for semiconductor device 10 from damage and contamination during the assembly process. Second, plastic housing 40 provides support and strain relief for electrical leads 18 and electrical terminals 16. Third, plastic housing 40 provides thermal protection for semiconductor device 10 during processing, including during the final over-mold process. Fourth, plastic housing 40 provides positioning data during the final over-molding step of the assembly process.

Finally, because semiconductor device 10 is no longer electrically connected to lead frame 30, semiconductor device 10 can be electrically tested at any time in the manufacturing process to maintain quality control of semiconductor devices 10. If a semiconductor device 10 fails an administered electrical test, then the dysfunctional semiconductor device 10 can be easily removed from lead frame 30 by braking the connection between positioning posts 32 and plastic housing 40, thereby alleviating the necessity to continue processing activities on the dysfunctional semiconductor devices 10 and maintaining quality control.

The preceding description is exemplary rather than limiting in nature. A preferred embodiment of this invention has been disclosed to enable one skilled in the art to practice this invention. Variations and modifications are possible without departing from the spirit and purview of this invention, the scope of which is limited only by the appended claims.

We claim:

1. A method for manufacturing and testing an encapsulated semiconductor device having a plurality of electrical terminals by using a metal lead frame having a plurality of positioning posts and a plurality of electrical leads, said semiconductor device being a sensor member and a signal conditioning integrated circuit member that are electrically connected to each other, the method comprising the steps of:

attaching the electrical terminals of the semiconductor device to the electrical leads of the lead frame;

positioning said sensor member approximately 90 degrees relative to said signal conditioning integrated circuit member;

encapsulating the semiconductor device in a plastic housing, said plastic housing also contacting the positioning posts, thereby connecting the semiconductor device and said plastic housing to the positioning posts; and disconnecting the electrical leads from the lead frame.

2. The method of claim 1, further comprising the steps of:

testing features of the semiconductor device;

removing the semiconductor device from the lead frame if the semiconductor device fails said test; and conducting additional processing if the semiconductor device passes said test.

* * * * *